United States Patent [19]

Suzuki et al.

[11] 4,020,362
[45] Apr. 26, 1977

[54] COUNTER USING AN INVERTER AND SHIFT REGISTERS

[75] Inventors: Yasoji Suzuki, Ayase; Kenshi Manabe; Masataka Hirasawa, both of Yokohama, all of Japan

[73] Assignee: Tokyo Shibaura Electric Co., Ltd., Tokyo, Japan

[22] Filed: July 2, 1975

[21] Appl. No.: 592,643

[30] Foreign Application Priority Data

July 5, 1974 Japan .............. 49-76940

[52] U.S. Cl. .............. 307/225 C; 307/221 C; 307/223 C
[51] Int. Cl.² .............. H03K 21/36; H03K 23/08
[58] Field of Search ....... 307/220 C, 221 C, 223 C, 307/225 C, 223 R

[56] References Cited

UNITED STATES PATENTS

| 3,421,092 | 1/1969 | Bower et al. | 307/221 C |
| 3,621,402 | 11/1971 | Gardner | 307/221 C |
| 3,745,371 | 7/1973 | Suzuki | 307/221 C |
| 3,766,408 | 10/1973 | Suzuki et al. | 307/223 C |
| 3,899,691 | 8/1975 | Hama | 307/223 C |

Primary Examiner—John S. Heyman
Attorney, Agent, or Firm—Finnegan, Henderson, Farabow & Garrett

[57] ABSTRACT

A counter comprises a cascade connection of an inverter stage and $n$ one-bit shift register stages, the latter being operative in response to clock signals to be counted and each having a data-readin or front half-bit shift register stage and a data-readout or rear half-bit shift register stage. The output of the final stage in the cascade connection is coupled to the input of the first stage in the cascade connection. The output of the final stage is also coupled to an additional input of consecutive 1st to X-th shift register stages or consecutive 2nd to (X-1)-th shift register stages of an X-th shift register stage to constitute a scale-of-$2n$-X or $2n$-(X-1) counter.

13 Claims, 10 Drawing Figures

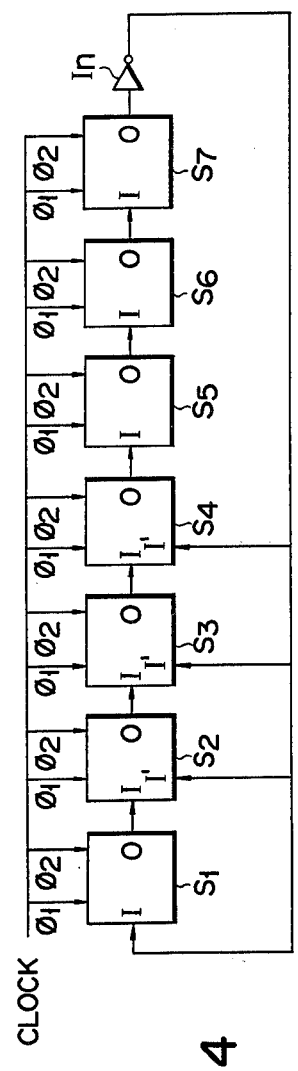
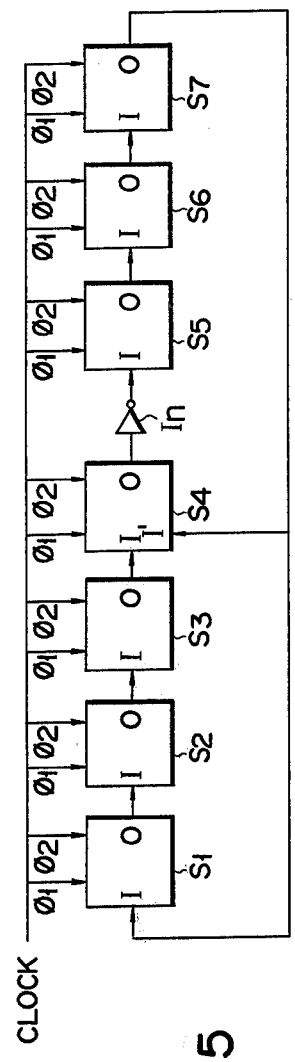
FIG. 4
FIG. 5

COUNTER USING AN INVERTER AND SHIFT REGISTERS

This invention relates to a counter comprised of an inverter and shift registers and suitable for an integrated circuit using insulated gate field effect transistors.

U.S. Pat. No. 3,766,408 discloses a scale-of-$n$ counter comprising an inverter and $n$-1 one-bit shift registers and adapted to produce an output having a frequency $1/n$ times that of clock signals to be counted. In this counter, the one-bit shift registers are connected in cascade and, each, has a data-readin half-bit shift register and data-readout shift register and the inverter is coupled between the ($n$-1)-th stage shift register and the first stage shift register.

Each of the 1st to ($n$-2)-th stage shift registers or 2nd to ($n$-1)-th stage shift registers has an additional or reset terminal and is operative to transfer to its output a data given to its input in response to clock signals to be counted, when the additional input is at a first voltage level, and operative to make its output at a predetermined voltage level when the additional input is at a second voltage level. If each of the 1st to ($n$-2)-th stage shift registers has an additional input, the output of the ($n$-1)-th shift register is coupled to the additional input of these shift registers and, if each of the 2nd to ($n$-1)-th shift registers has an additional input, the output of the inverter is coupled to the additional input of these shift registers. In the former case, the additional input of the shift registers is coupled to a data-readout half-bit shift register of the one-bit shift registers and in the latter case the additional input of the shift registers is coupled to a data-readin half-bit shift register of the one-bit shift registers.

With the above-mentioned scale-of-$n$ counter, $n$-1 one-bit shift registers or $2(n$-1$)$ half-bit shift registers are required. In a scale-of-11 counter, for example, 10 one-bit shift registers and thus 20 half-bit shift registers are necessary.

Recently, a table-top type electronic calculator, etc., for example, widely utilizes high density integrated circuits and to manufacture such high density integrated circuits it is desired that the number of components in a circuit designed for one function be reduced.

It is accordingly the object of this invention to provide a counter capable of accomplishing a desired scale counting using a lesser number of shift registers.

According to one aspect of this invention there is provided a counter for counting clock signals comprising $2n$+1 cascade-connected stages each having an input and output, one stage of which is an inverter and the remaining $2n$ stages of which are 1st to $2n$-th half-bit shift registers each operative to produce at the output an output state corresponding to an input data state at the input in response to clock signals to be counted, at least one of the even-numbered stages of the 2nd to $2(n$-2$)$-th half-bit shift register stages or at least one of the odd-numbered stages of the 3rd to ($2n$-3)-th half-bit shift register stages having an additional input and being operative to produce at the output an output state corresponding to an input data state on the input when the additional input is at a first voltage level and operative to make the output at a predetermined voltage level when the additional input is at a second voltage level; means for coupling the output of the final stage of said cascade connection to the input of the first stage of said cascade connection and the additional input of at least one of the half-bit shift registers; and means for applying clock signals to each of the $2n$ half-bit shift register stages to operate $n$ odd-numbered half-bit shift register stages and $n$ even-numbered half-bit shift register stages alternately.

This invention can be more fully understood from the following detailed description when taken in conjunction with the accompanying drawings, in which:

FIG. 4 is a block diagram of a counter according to a still further embodiment of this invention;

FIG. 5 is a block diagram of a counter according to another embodiment of this invention;

Figures 1, 2:
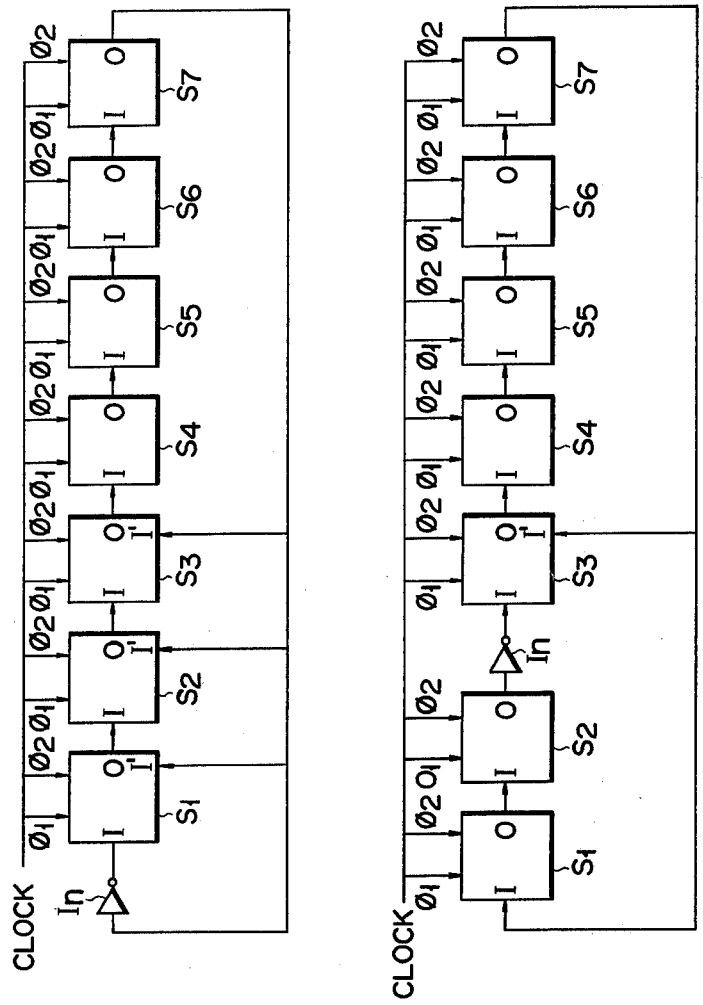
FIG. 1 is a block diagram of a counter according to one embodiment of this invention.
FIG. 2 is a block diagram of a counter according to another embodiment of this invention.

FIG. 1 shows one embodiment of this invention. In this Figure an inverter $I_n$ and $n$ one-bit shift registers, for example seven one-bit shift registers $S_1$ to $S_7$ are connected in cascade configuration, the output of the final-stage shift register ($S_7$ in FIG. 1) being coupled to the input of the inverter $I_n$. Each one-bit shift register consists of a data-readin half-bit shift register and a data-readout half-bit shift register and is operated to read in an input data applied to an input I in response to a writing clock signal $\phi_1$ and to read out the input data from an output O in response to a readout clock signal $\phi_2$. The 1st to X-th stage shift registers ($X$=3 in this case), each, has a reset or additional input I' coupled to the output of the final stage shift register ($S_7$ in this case).

The shift register having the additional input I' is operative to transfer a data on the input I to the input O of the shift register in response to the clock signals $\phi_1$ and $\phi_2$, when the additional input I' is at a first voltage level, for example, a voltage level corresponding to logic "0," and make the output O at a predetermined voltage level, for example, a voltage level corresponding to logic 0 when the additional input I' of the shift register is at a second voltage level, for example, a voltage level corresponding to logic "1". In the arrangement shown in FIG. 1 the additional input I' of the shift register is coupled to the output stage of one-bit shift register, or the data-readout half-bit shift register. When, therefore, the additional input I' of the shift register is at the voltage level corresponding to logic 1, the output O of that shift register is forcedly brought to logic 0 state.

In the counter shown in FIG. 1, suppose that the outputs of the shift registers $S_1$ to $S_7$ are initially 0 state and thus the output of the inverter $I_n$ is 1 state. In this case, successive seven pairs of clock signals $\phi_1$, $\phi_2$ are required to bring all the outputs of the shift registers $S_1$ to $S_7$ to the 1 state by the output 1 of the inverter $I_n$. When the output of the shift register $S_7$ becomes 1, the outputs O of the shift registers $S_1$ to $S_3$ having the additional input I' as well as the output of the inverter $I_n$ are rendered 0. In order to bring the outputs of the shift registers $S_4$ to $S_7$ to the 0 state by the outputs 0 of the inverter $I_n$ and shift registers $S_1$ to $S_3$, next subsequent four pairs of clock signals $\phi_1$ and $\phi_2$ are further necessary.

It will be noted that, since the outputs of the inverter $I_n$ and shift registers $S_1$ to $S_7$ can be returned to the original 1 and 0 states, respectively, by arrival of the successive 11 pairs of clock signals $\phi_1$ and $\phi_2$, the counter of FIG. 1 acts as a scale-of-11 counter, and the frequency of each output of the inverter $I_n$ and shift registers $S_1$ to $S_7$ becomes one-eleventh that of the clock signals $\phi_1$ and $\phi_2$.

Where, among the $n$ one-bit shift registers, the consecutive 1st to X-th stage one-bit shift registers (X=an integer from 2 to $n$-2) have an additional input I' coupled to the output of the $n$-th stage shift register, a scale-of-2n-X counter is constituted. The arrangement shown in FIG. 1 corresponds to the case where $n$=7 and X=3. In this embodiment, the inverter $I_n$ may be coupled between the data-readin half-bit shift register and the data-readout half-bit shift register in the first stage one-bit shift register $S_1$.

Where the embodiment of FIG. 1 is considered as including 2n halfbit shift registers, the consecutive even-numbered stages from the 2nd stage half-bit shift register (corresponding to the data-readout half-bit shift register in the first stage one-bit shift register $S_1$) to the 2X-th half-bit shift register (corresponding to the data-readout half-bit shift register in the X-th stage one-bit shift register) have an additional input I'.

The scale-of-11 counter shown in FIG. 1 consists of seven one-bit shift registers, which can save three shift registers as compared with a conventional counter, thus reducing the number of elements to a considerable extent. Each of the shift registers $S_4$ to $S_7$ may have an additional input, too. Where a voltage corresponding to logic 0 is normally applied to the additional inputs of the shift registers $S_4$ to $S_7$, the same scaling operation is effected. This means that all the shift registers may, each, have an additional input, and if the additional input of the shift registers required is coupled to the output of the final stage shift register, then a desired scaling operation can be effected.

FIG. 2 shows a scale-of-11 counter in which the third stage shift register $S_3$ only has the additional input I' coupled to the output O of the final stage shift register $S_7$. In the embodiment of FIG. 2 the inverter $I_n$ may be connected at any point between the output of a readin half-bit shift register in the third stage one-bit shift register $S_3$ having the additional input I' and the input of readin half-bit shift register in the first stage one-bit shift register $S_1$.

Suppose that, in this embodiment, the outputs of shift registers $S_1$ to $S_7$ are initially the 0 state and in consequence the output of the inverter $I_n$ is the 1 state. In this case, successive five pairs of clock signals $\phi_1$, $\phi_2$ will be required to bring the outputs of shift registers $S_3$ to $S_7$ to the 1 state by the output 1 of the inverter $I_n$. When the output of the final stage shift register $S_7$ becomes 1, the output of the third stage shift register $S_3$ becomes 0. In order to bring the outputs of the shift registers $S_4$ to $S_7$ to the 0 state by the output 0 of the shift register $S_3$, the next subsequent four pairs of clock signals $\phi_1$, $\phi_2$ are further required. At the time when the output of the shift register $S_7$ becomes 0, the outputs of the shift registers $S_1$ and $S_2$ are 1. In order to bring the outputs of the shift registers $S_1$ and $S_2$ to the 0 state, the next subsequent two pairs of clock signals $\phi_1$, $\phi_2$ are further required. As will be understood from the above, the outputs of the shift registers $S_1$ to $S_7$ are all returned to the original 0 state upon arrival of the 11 pairs of clock signals $\phi_1$, $\phi_2$ and thus a counter of FIG. 2 effects counting on the basis of a scale-of-11 as in the case of the counter of FIG. 1.

Suppose that, in the embodiment of FIG. 2 $n$ number of shift registers is used. If, in this case, an X-th shift register has an additional input I' coupled to the output of the $n$-th stage shift register, counting is effected on the basis of a scale-of-2n-X, in which X is an integer from 1 to $n/2$, if $n$ is an even number, and 1 to $(n-1)/2$ if $n$ is an odd number. In the embodiment of FIG. 2 in which $n$=7, any shift registers $S_1$ to $S_3$ may have an additional input I'. Where, for example, the shift register $S_1$ has an additional input I', a scale-of-13 (2×7=13) counting is carried out. Where, on the other hand, the shift register $S_2$ has an additional input I', a scale-of-12 (2×7−2=12) counting is conducted. In the former case, the inverter $I_n$ should be coupled to the input or output of the readin half-bit shift register in the shift register $S_1$ and, in the latter case, the inverter $I_n$ should be coupled between the input of the readin half-bit shift register in the shift register $S_2$ and the output of the readout half-bit shift register in the shift register $S_1$.

If the embodiment of FIG. 2 is considered as a counter having 2n number of half-bit shift registers, only the data-readout half-bit shift register in a 2X-th stage may have an additional input, provided that X is an integer from 1 to $n/2$, if $n$ is an even number, and 1 to $(n-1)/2$ if $n$ is an odd number.

FIG. 4 shows another embodiment of this invention. In this embodiment, one-bit shift registers $S_2$ to $S_4$, each, have an additional input I'. An inverter $I_n$ is coupled to the output of a final stage shift register $S_7$ and the output of the inverter $I_n$ is coupled to the input of the first stage shift register $S_1$ and the additional inputs I' of the shift registers $S_2$ to $S_4$. In this embodiment, the additional input I' of the shift registers $S_2$ to $S_4$ is coupled to the input stage or the readin half-bit shift register thereof. When the additional input I' of the shift registers $S_2$ to $S_4$ is, for example, at the voltage level 1, each of the shift registers $S_2$ to $S_4$ transfers a data on the input I of the shift registers $S_2$ to $S_4$ to the output O of the shift registers $S_2$ to $S_4$ in response to clock signals $\phi_1$, $\phi_2$. When, on the other hand, the additional input I' of the shift registers $S_2$ to $S_4$ is at the voltage level 0, each of the shift registers $S_2$ to $S_4$ is operative to bring the output O to a predetermined voltage level, for example, a voltage level corresponding to logic 0. If all the outputs of the shift registers $S_1$ to $S_7$ are initially 0 state and in consequence the output of the inverter $I_n$ is 1 state, then successive seven pairs of clock signals, $\phi_1$, $\phi_2$ are required to bring the outputs of the shift registers $S_1$ to $S_7$ to the 1 state by the 1 output of the inverter $I_n$. When the output of the shift register $S_7$ becomes 1 and in consequence the output of the inverter $I_n$ becomes 0, the output of the shift registers $S_2$ to $S_4$ becomes 0 in synchronism with the next readout signal $\phi_2$. In order to bring the output of the shift registers $S_5$ to $S_7$ to the 0 state by the output 0 of the shift registers $S_2$ to $S_4$, i.e., return all the outputs of the shift registers $S_1$ to $S_7$ to the original 0 state, the next subsequent three pairs of clock signals $\phi_1$, $\phi_2$ are further necessary. As will be evident from the above, since all the outputs of the shift registers $S_1$ to $S_7$ are returned to the original state by arrival of successive 11 pairs of clock signals $\phi_1$, $\phi_2$, a scale-of-11 counting is carried out.

Where $n$ one-bit shift registers are provided, the consecutive 2nd to X-th stage shift registers ($x$=an integer from 3 to $n-1$) may have an additional input I'. In this case, a scale-of-$2n-(X-1)$ counting is effected. The embodiment of FIG. 4 shows the case where $n=7$ and $X=4$. The inverter $I_n$ may be connected at any point between the output of the readin half-bit shift register in the X-th stage one-bit shift register and the output of the $n$-stage one-bit shift register. Assume that the embodiment of FIG. 4 has $2n$ half-bit shift registers. In this case, the odd-numbered stage half-bit shift registers (data-readin half-bit shift registers) from the third stage half-bit shift register (corresponding to the data-readin half-bit shift register in the 2nd one-bit shift register $S_2$) to the $(2X-1)$ stage half-bit shift register (corresponding to the data-readin half-bit shift register in the X-th stage one-bit shift register) has an additional input. The inverter $I_n$ may be connected to output of either one of the $(2X-1)$-th to $2n$-th stage half-bit shift registers.

FIG. 5 shows a scale-of-11 counter in which a fourth stage one-bit shift register $S_4$ alone has an additional input I' and the inverter is connected between $S_4$ and $S_5$. Suppose that all the outputs of shift registers $S_1$ to $S_7$ are, at first, 0 and thus the output of the inverter $I_n$ is 1. In this case, successive three pairs of clock signals $\phi_1$, $\phi_2$ are required to bring the output of the registers $S_5$ to $S_7$ to the 1 state by the output 1 of the inverter $I_n$. The output of the shift registers $S_1$ and $S_4$ becomes 1 upon arrival of the next fourth pair of clock signals $\phi_1$, $\phi_2$ and in consequence the output of the inverter $I_n$ becomes 0. In order to bring the output of the shift registers $S_5$ to $S_7$ to the 0 state by the output 0 of the inverter $I_n$, the next subsequent three pairs of clock signals $\phi_1$, $\phi_2$ are further required. At this time, the output of the shift registers $S_1$ to $S_4$ is 1. In order to bring the output of the shift registers $S_1$ to $S_4$ to the 0 state, the next subsequent four pairs of clock signals $\phi_1$, $\phi_2$ are further necessary. That is, the output of each shift register is returned to the original state 0 upon arrival of the successive 11 pairs of $100_1$, $\phi_2$. As a result, a scale-of-11 counting is carried out.

Suppose that the embodiment of FIG. 5 has $n$ one-bit shift registers. Where $n$ is an even number, any one of the 2nd to $(n+2)/2$-th stage one-bit shift register may have an additional input I'. Where, on the other hand, $n$ is an odd number, any one of the 2nd to $(n+1)/2$-th stage one-bit shift registers may have an additional input I'. If the X-th stage one-bit shift register has an additional input I', a scale-of-$2n-(X-1)$ counting can be effected. The embodiment of FIG. 5 shows the case where $n=7$ and $X=4$.

Consider the embodiment of FIG. 5 as having $2n$ half-bit shift registers. In this case, the $(2X-1)$-th stage half-bit shift register (corresponding to the data-readin half-bit shift register in the X-th stage one-bit shift register) may have an additional input I'. The inverter $I_n$ may be coupled to the output of either one of the $(2X-1)$-th to $2n$-th half-bit shift registers.

Figure 3:
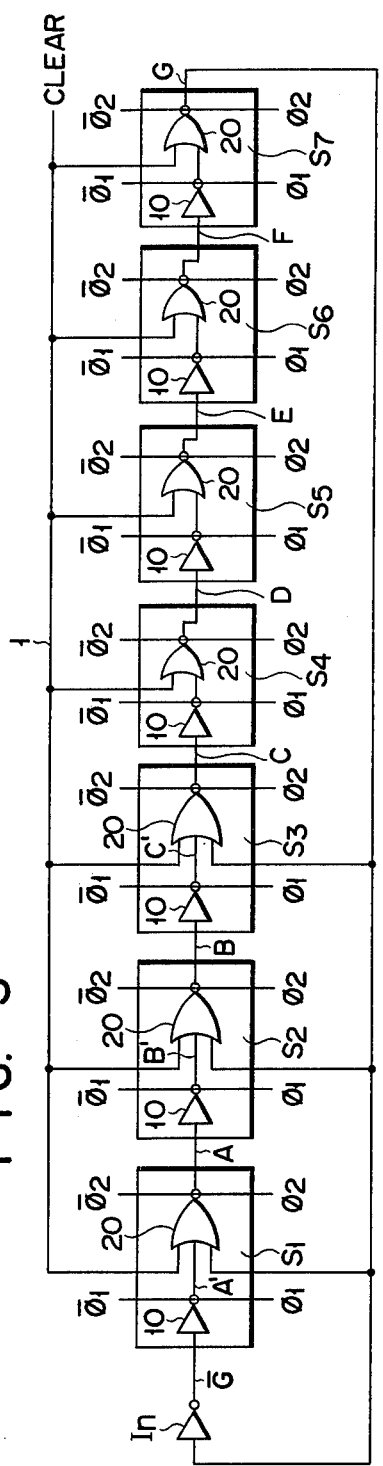
FIG. 3 is a block diagram of a counter according to a further embodiment of this invention.

FIG. 3 shows an embodiment of a scale-of-11 counter according to the type of FIG. 1. In this embodiment, each one-bit shift register uses, as its data-readin half-bit shift register, a clocked inverter 10 operative to invert an input data by application of complementary clock signals $\phi_1$, $\bar{\phi}_1$, and as its data-readout half-bit shift register a clocked NOR circuit 20 fundamentally including a clocked inverter operated by complementary clock signals $\phi_2$, $\bar{\phi}_2$. To the clocked NOR circuit 20 of one-bit shift registers $S_1$ to $S_3$ are applied the output of the clocked inverter 10, the output of the final stage one-bit shift register $S_7$ and a clear signal on a clear signal line 1. When the clear signal and the output of the shift register $S_7$ are both at the voltage level 0, the clocked NOR circuits 20 act as a clocked inverter. When, on the other hand, either the clear signal or the output of the shift register $S_7$ is the voltage level 1, the clocked NOR circuits are operative to make their outputs at the voltage level 0 irrespective of the output of the corresponding clocked inverter 10. The output of the clocked inverter 10 and clear signal on the clear signal line 1 are applied to the clocked NOR circuit 20 in the shift registers $S_4$ to $S_7$.

Figure 7:
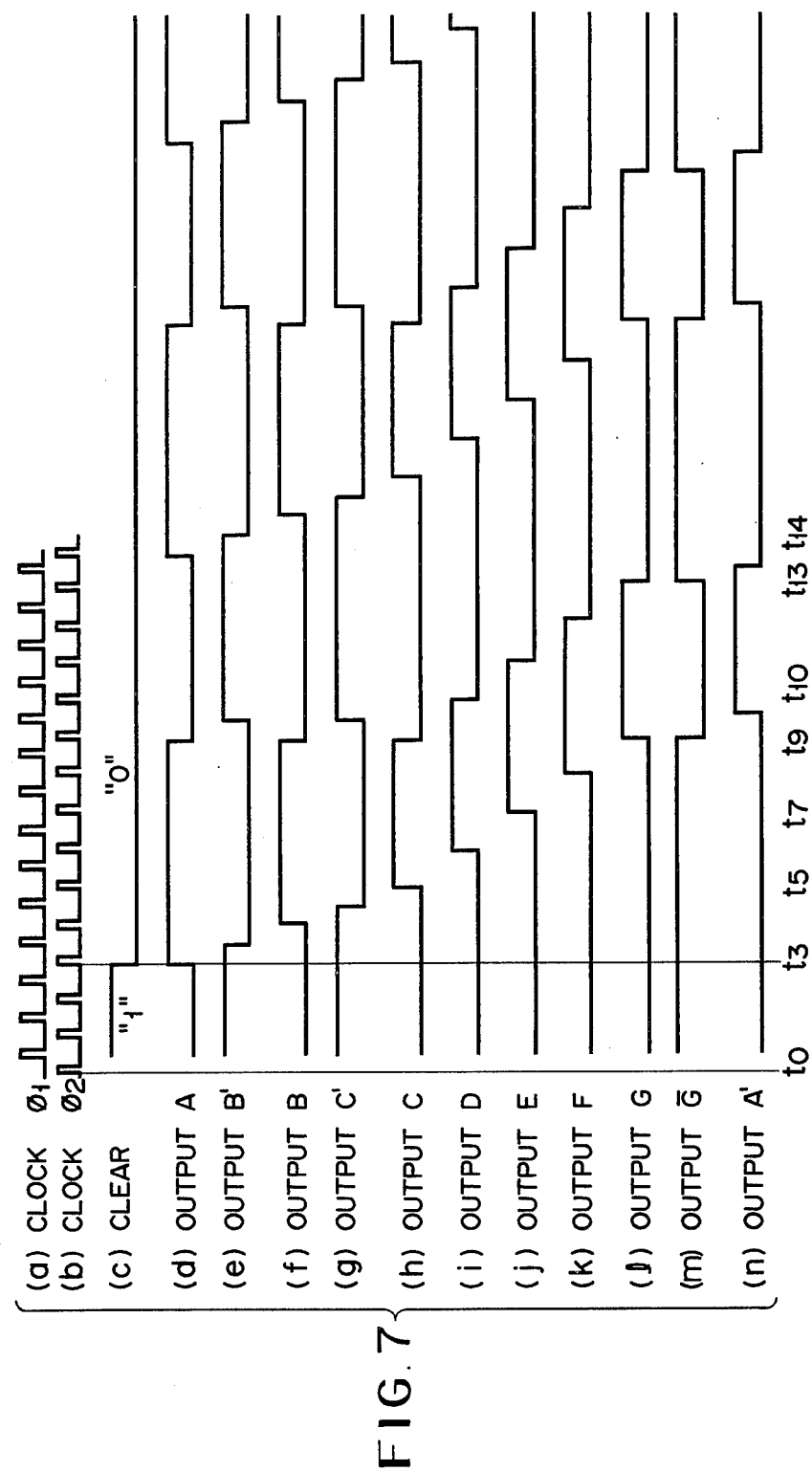
FIG. 7 is a waveform diagram for explaining the operation of the counter of FIG. 3.

The operation of the counter shown in FIG. 3 will now be explained by referring to FIG. 7.

By a clear signal with a voltage level of 1, the outputs A to G of the shift registers $S_1$ to $S_7$ are made at the voltage level 0 and in consequence the output $\bar{G}$ of the inverter $I_n$ is made at the voltage level 1. When the clear signal becomes 0 at time $t_3$, the output A of the shift register $S_1$ is made at the 0 state. By the output A with the voltage level 1, the outputs B to G of the shift registers $S_2$ to $S_7$ are sequentially brought to the 1 state in response to the clock signals $\phi_1$ and $\phi_2$. At time $t_9$, the output G of the final stage shift register $S_7$ becomes 1, and the outputs A to C of the shift registers $S_1$ to $S_3$ become 0. Subsequently, the outputs D to G of the shift registers $S_4$ to $S_7$ are sequentially made at the 0 state. At time $t_{14}$, the output A of the shift register $S_1$ becomes 1. This means that the outputs of the shift registers $S_1$ to $S_7$ and the output of the inverter $I_n$ are all returned to the original state. As will be evident from the waveform of FIG. 7 the outputs of the shift registers $S_1$ to $S_7$ and inverter $I_n$, all, have a period 11 times that of the clock signals $\phi_1$, $\phi_2$.

Figure 6:
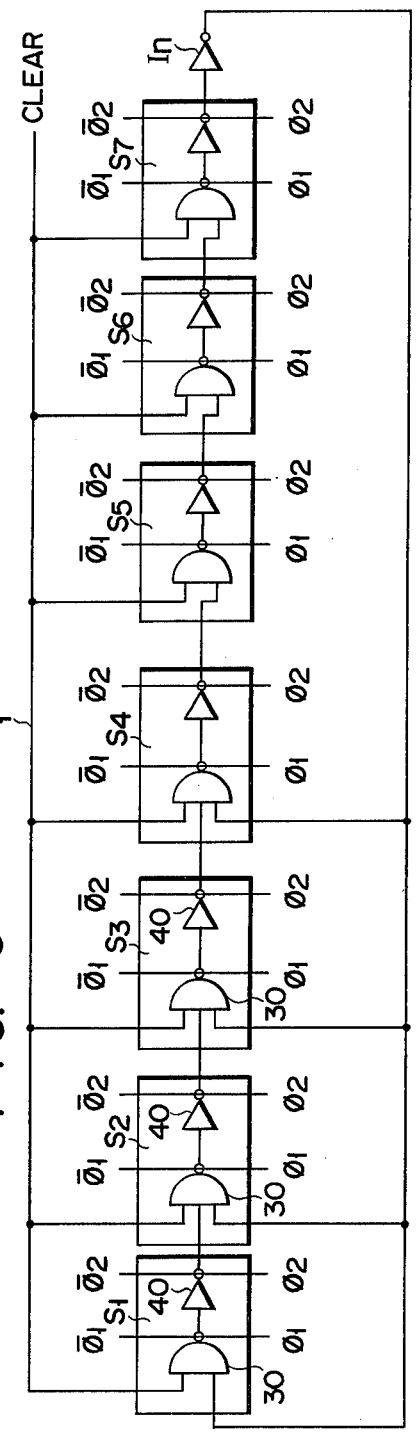
FIG. 6 is a block diagram of a counter according to a further embodiment of this invention.

FIG. 6 shows an embodiment of a scale-of-11 counter of the type shown in FIG. 4. In this embodiment, each one-bit shift register uses a clocked NAND circuit 30 as a data-readin half-bit shift register and a clocked inverter 40 as a data-readout half-bit shift register.

While, in the embodiments shown in FIGS. 3 and 6, the clear signal is supplied to each one-bit shift register, application of the clear signal is not always necessary. The clear signal may be delivered to at least one one-bit shift register. Where, in the embodiments of FIGS. 3 and 6, the inverter $I_n$ is coupled between the data-readin half-bit shift register and the data-readout half-bit shift register in a one-bit shift register, the clocked NOR circuit and clocked NAND circuit may be replaced by the clocked NAND circuit and clocked NOR circuit, respectively.

Figure 8:
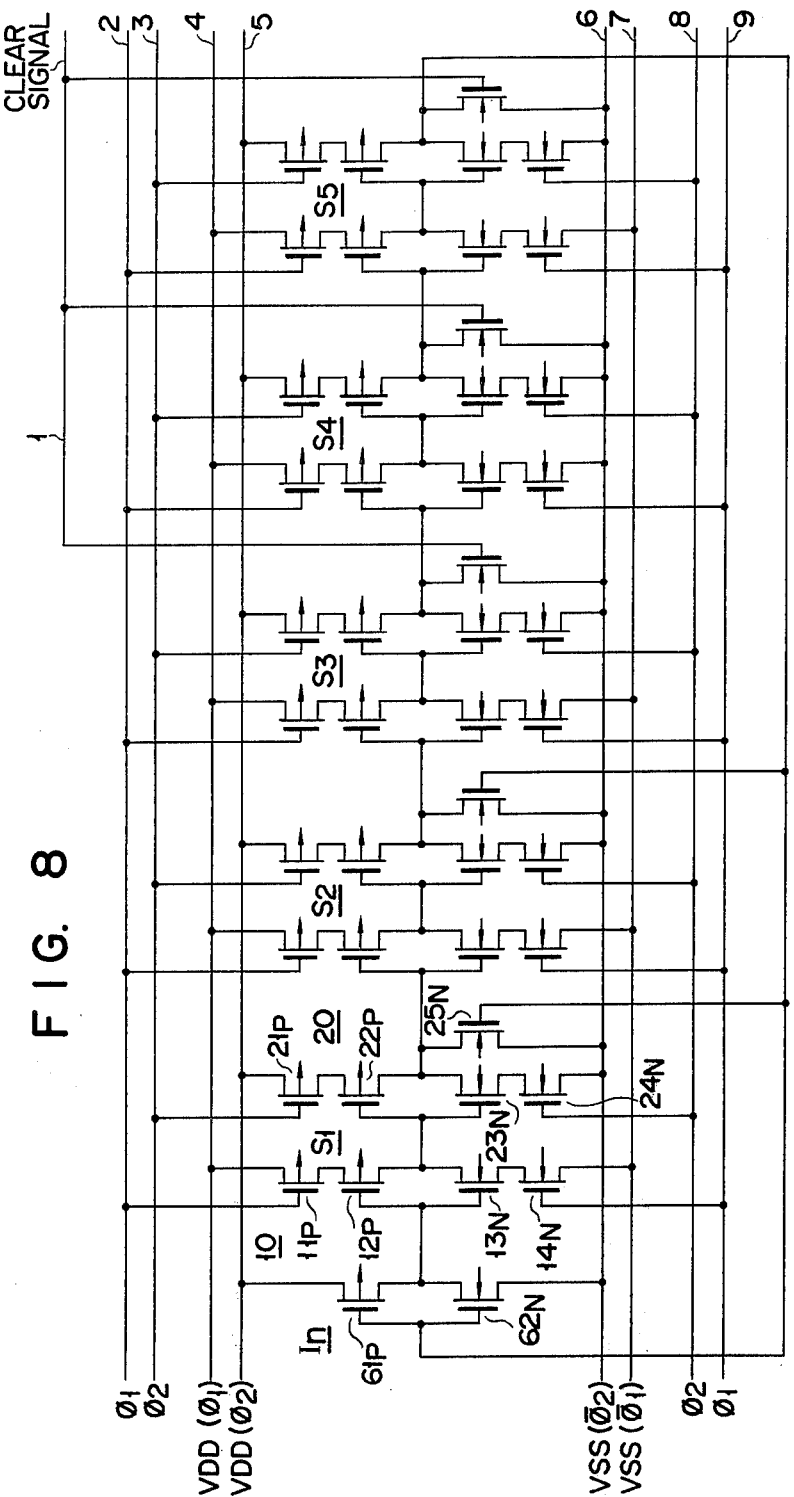
FIGS. 8 to 10, each, show a circuit arrangement of a counter embodying this invention, in which complementary insulated gate field effect transistors are used.

FIG. 8 shows a circuit arrangement of a scale-of-8 counter using five one-bit shift registers $S_1$ to $S_5$ according to the type of FIG. 3. An inverter $I_n$ includes complementary insulated gate field effect transistors $61_P$, $62_N$ whose source-drain paths are series connected between a VDD (or clock signal $\phi_2$) supply line 5 and a VSS (or clock signal $\bar{\phi}_2$) supply line 6. The gate electrodes of transistors $61_P$ and $62_N$ are coupled to the output of the final stage one-bit shift register $S_5$. A first stage one-bit shift register $S_1$ has a clocked inverter 10 as a date-readin half-bit shift register and a clocked NOR circuit 20 as a data-readout half-bit shift register. The clocked inverter 10 has complementary inverting transistors $12_P$ and $13_N$ and complementary switching transistors $11_P$ and $14_N$. The source-to-drain paths of these transistors $11_P$, $12_P$, $13_N$ and $14_N$ are serially connected between a VDD (or clock signal $\phi_1$) supply line 4 and a VSS (or clock signal $\overline{\phi}_1$) supply line 7. The gate electrodes of the inverting transistors $12_P$ and $13_N$ are connected to the drain electrodes of the transistors $61_P$ and $61_N$ in the inverter $I_n$. Clock signals $\overline{\phi}_1$ and $\phi_1$ are applied respectively through clock lines 2 and 9 to the gate electrodes of switching transistors $11_P$ and $14_N$. The clocked NOR circuit 20 includes complementary inverting transistors $22_P$ and $23_N$ and complementary switching transistors $21_P$ and $24_N$. The source-drain paths of these transistors $21_P$, $22_P$, $23_N$ and $24_N$ are serially connected between the VDD supply line 5 and the VSS supply line 6. The gate electrodes of the inverting transistors $22_P$ and $23_N$ are connected to the drain electrodes of the inverting transistors $12_P$ and $13_N$ in the clocked inverter 10. Clock signals $\overline{\phi}_2$ and $\phi_2$ are applied respectively through clock lines 3 and 8 to the gate electrodes of the switching transistors $21_P$ and $24_N$. The source-to-drain path of an N channel transistor $25_N$ is connected between the VSS supply line 6 and the drain electrodes of the inverting transistors $22_P$ and $23_N$, and the gate of transistor $25_N$ is coupled to the output of the final stage shift register $S_5$. Other one-bit shift registers $S_2$ to $S_5$ are constructed like the shift register $S_1$, but the gate electrode of each transistor in shift registers $S_3$ to $S_5$ which corresponds to the transistor $25_N$ in the shift register $S_1$ is coupled to the clear signal line 1.

Figure 9:
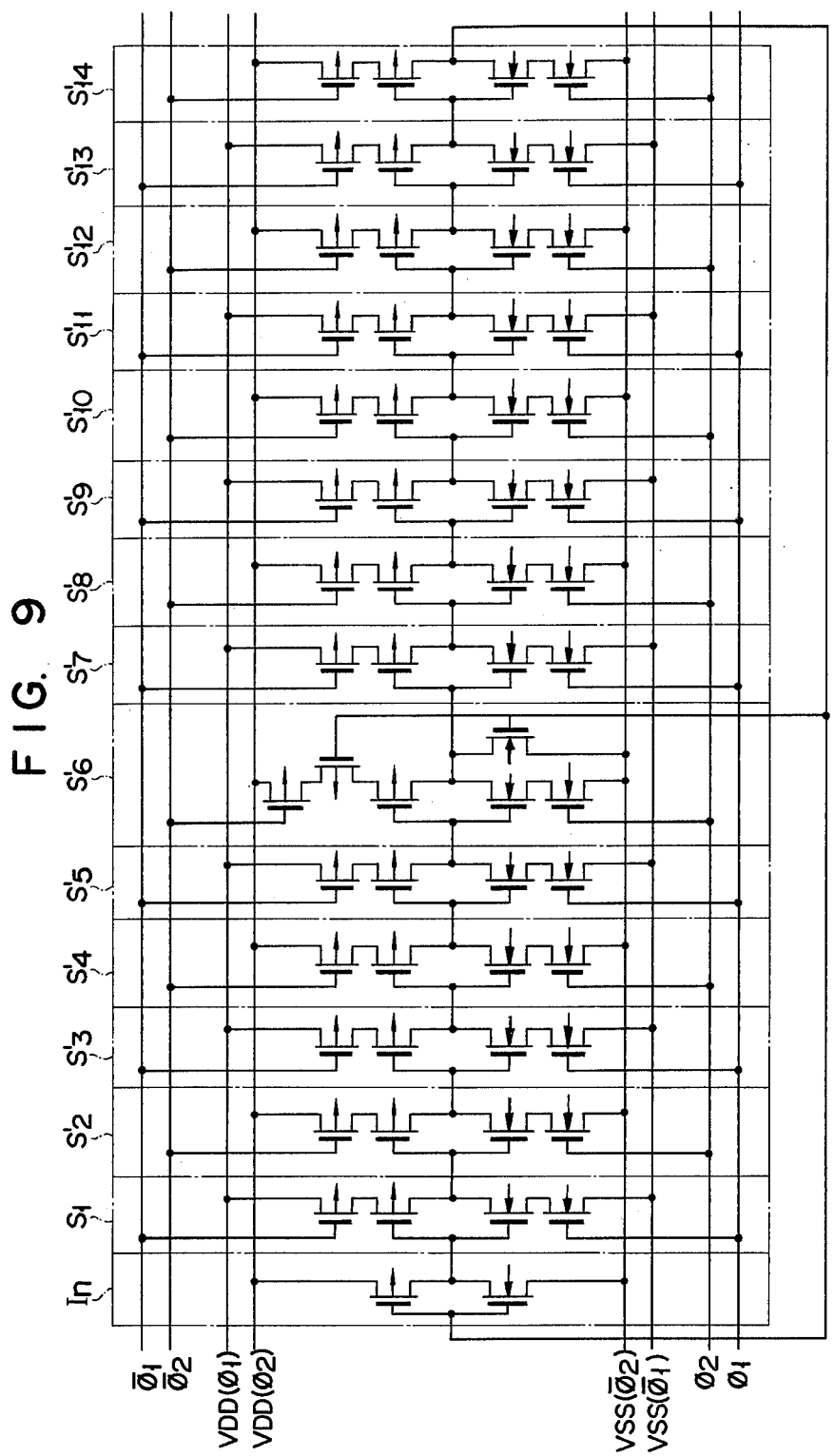

FIG. 9 shows a circuit arrangement of a scale-of-11 counter according to the type of FIG. 2, though different in the connecting position of an inverter $I_n$. Among 14 stage half-bit shift registers $S'_1$ to $S'_{14}$, only the sixth stage half-bit shift register $S'_6$ corresponding to the data-readout half-bit shift register of the third stage one-bit shift register $S_3$ is composed as a clocked NOR circuit.

Figure 10:
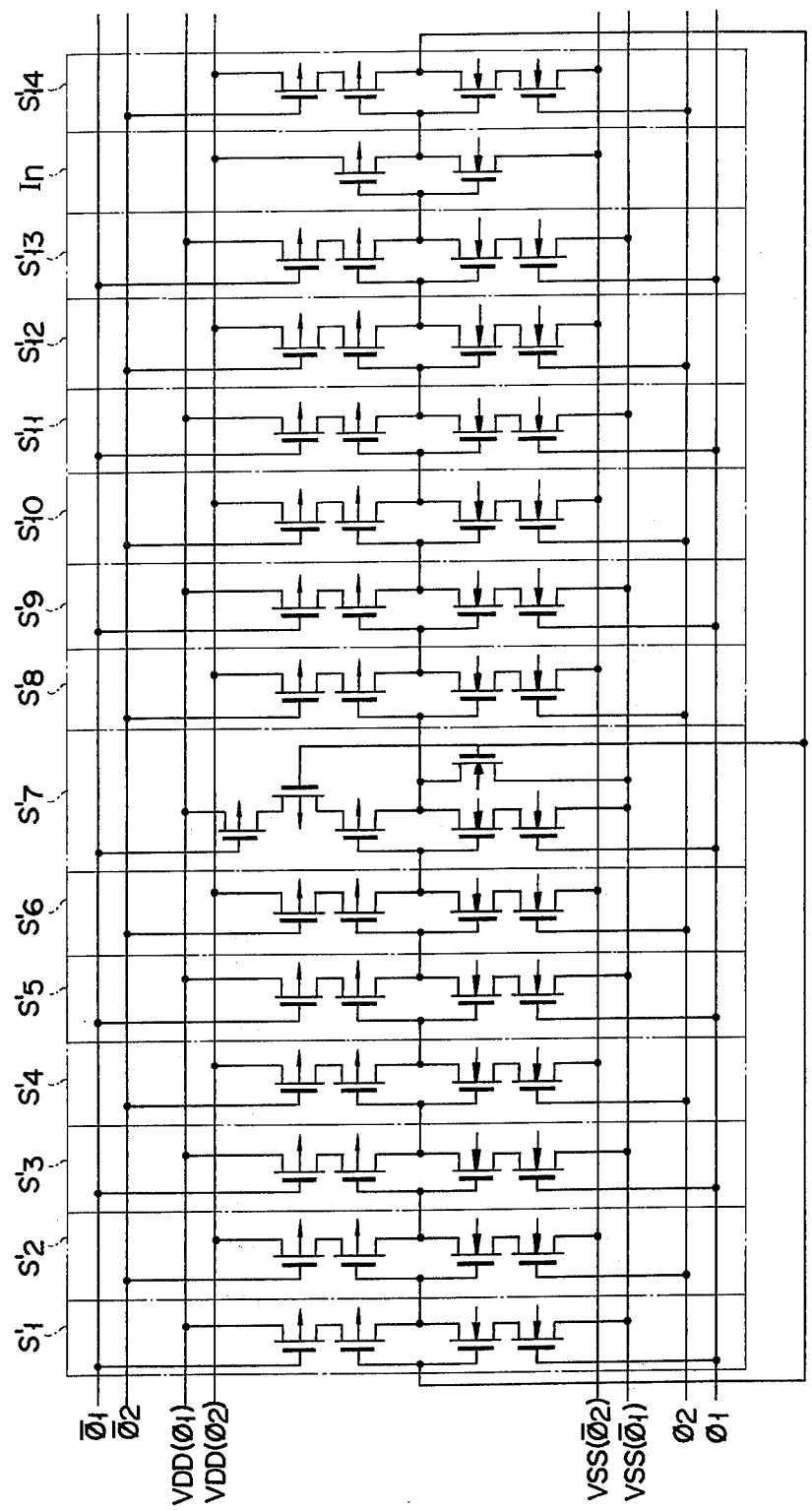

FIG. 10 shows a circuit arrangement of a scale-of-11 counter according to the type of FIG. 5, though different in the connecting position of an inverter $I_n$. Among 14 stage half-bit shift registers $S'_1$ to $S'_{14}$, only the seventh stage half-bit shift register $S'_7$ corresponding to the data-readin half-bit shift register in the fourth stage one-bit shift register $S_4$ is composed as a clocked NOR circuit. The reason for this is that the inverter $I_n$ is coupled between the data-readin half-bit shift register $S'_{13}$ and the data-readout half-bit shift register $S'_{14}$ in the seventh stage one-bit shift register $S_7$.

Although the counters shown in FIGS. 8 to 10 use complementary insulated gate field effect transistors, each counter may be constituted using either p- or n-channel type insulated gate field effect transistors only. While the above-mentioned embodiments uses dynamic shift registers, static shift registers can also be used. Further, in the invention, a clocked bistable circuit comprised of two cross-coupled NAND/NOR gates can be used as a half-bit shift register. In this case, an inverter stage is connected between two one-bit shift register stages.

What we claim is:

1. A counter for counting clock signal comprising $2n+1$ cascade-connected stages each having an input and output, one stage of which is an inverter and the remaining $2n$ stages of which are 1st to $2n$-th half-bit shift registers each operative to produce at the output an output state corresponding to an input data state at the input in response to clock signals to be counted, at least one of the even-numbered stages of the 2nd to $2(n-2)$-th half-bit shift register stages only or at least one of the odd-numbered stages of the 3rd to $(2n-3)$-th half-bit shift register stages only having an additional input and being operative to produce at the output an output state corresponding to an input data state on the input when the additional input is at a first voltage level and operative to make the output at a predetermined voltage level when the additional input is at a second voltage level; means for coupling the output of the final stage of said cascade connection and the additional input of at least one of the half-bit shift registers; and means for applying clock signals to each of the $2n$ half-bit shift register stages to operate $n$ odd-numbered half-bit shift register stages and $n$ even-numbered half-bit shift register stages alternately to form $2n-x$ and $2n-(x-1)$ counters, wherein $x$ is a selected stage.

2. A counter according to claim 1 in which each of consecutive even-numbered ones of the 2nd to 2X-th half-bit shift registers ($X=$an integer from 2 to $(n-2)$) has the additional input, and said inverter stage is coupled to the first half-bit shift register stage to form a counter of the scale $2n$-X.

3. A counter according to claim 1 in which each of consecutive odd-numbered stages of the 3rd to $(2X-1)$-th half-bit shift registers ($X=$an integer from 3 to $n-1$) has the additional input, and said inverter stage is coupled to the output of one of the $(2X-1)$-th to $2n$-th half-bit shift register stages to form a counter of the scale $2n$-(X-1).

4. A counter according to claim 1 in which only a 2X-th half-bit shift register stage has the additional input where X is an integer from 1 to $n/2$ if $n$ is an even number and 1 to $(n-1)/2$ if $n$ is an odd number, and said inverter stage is coupled to the input of one of the 1st to 2X-th half-bit shift register stages forming a counter of the scale $2n$-X.

5. A counter according to claim 1, in which only a (2X-1)-th half-bit shift register stage has the additional input where X is an integer from 2 to $n/2+1$ if $n$ is an even number and 2 to $(n+1)/2$ is $n$ is an odd number; and said inverter stage is coupled to the output of one of the (2X-1)-th to 2n-th half-bit shift register stages to form a counter of the scale $2n$-(X-1).

6. A counter according to claim 1 further including means responsive to a clear signal to make at least one of the outputs of the half-bit shift register stages at a predetermined voltage level.

7. A counter according to claim 1 in which each of said half-bit shift register stages comprises a clocked inverter.

8. A counter according to claim 1 in which said shift register stages and inverter stage are each comprised of insulated gate field effect transistors.

9. A counter according to claim 1 in which said shift register stages and inverter stage are each comprised of complementary insulated gate field effect transistors.

10. A counter for counting clock signals comprising $n$ cascade-connected one-bit shift register stages each having an input and output and operative to transfer to its output an input data which is applied to its input in response to clock signals to be counted, 1st to X-th ($X=$an integer from 2 to $n$-2) shift register stages only having an additional input and being operative to transfer to its output an input data which is applied to its input in response to clock signals, when the additional input is at a first voltage level and operative to make its output at a predetermined voltage level when the additional input is at a second voltage level; an inverter stage coupled between the output of the $n$-th shift register stage and the input of the 1st shift register stage;

means for coupling the additional input of the 1st to X-th shift register stages to the output of said $n$-th shift register stages; and means for applying clock signals to each of said shift register stages, said counter thereby counting on the scale of $2n$-X.

11. A counter for counting clock signals comprising $n+1$ cascade-connected stages each having an input and output, one of which is an inverter and the remaining $n$ stages of which are 1st to $n$-th one-bit shift registers each operative to transfer to its output an input data which is applied to its input in response to clock signals to be counted, each of the 2nd to X-th (X=an integer from 3 to $n$-1) shift register stages and none other having an additional input and operative to transfer to its output an input data which is applied to its input when the additional input is at a first voltage level and operative to make its output at a predetermined voltage level when the additional input is at a second voltage level; means for coupling the output of the final stage of said cascade connection to the input of the first stage and the additional input of the 2nd to X-th shift register stages; and means for applying clock signals to the shift register stages; said inverter stage being coupled to the output of one of the X-th to $n$-th shift register stages, said counter thereby counting on the scale of $2n$-(X-1).

12. A counter for counting clock signals comprising $n+1$ cascade-connected stages each having an input and output, one of which stages is an inverter and the remaining $n$ stages of which are 1st to $n$-th one-bit shift register stages each operative to transfer to its output an input data which is applied to its input in response to clock signals to be counted, an X-th shift register stage only having an additional input and being operative to transfer to its output an input data which is applied to its input when its additional input is at a first voltage level and operative to make its output at a predetermined voltage level when its additional input is at a second voltage level, where X is an integer from 1 to $n/2$ when $n$ is an even number and 1 to $(n-1)/2$ when $n$ is an odd number; means for coupling the output of the final stage of said cascade connection to the input of the first stage and the additional input of the X-th shift register stage; and means for applying clock signals to each of the shift register stages; said inverter stage being coupled to the input of one of the 1st to X-th shift register stages, said counter thereby counting on the scale of $2n$-X.

13. A counter for counting clock signals comprising $n+1$ cascade-connected stages each having an input and output, one of which stages is an inverter and the remaining $n$ stages of which are 1st to $n$-th one-bit shift register stages each operative to transfer to its output an input data which is applied to its input in response to clock signals to be counted, an X-th shift register stage only having an additional input and being operative to transfer to its output an input data which is applied to its input when its additional input is at a first voltage level and operative to make its output at a predetermined voltage level when its additional input is at a second voltage level, where X is an integer from 1 to $n/2$ when $n$ is an even number and 1 to $(n-1)/2$ when $n$ is an odd number; means for coupling the output of the final stage of said cascade connection to the input of the first stage and the additional input of the X-th shift register stage; and means for applying clock signals to each of the $n$ shift register stages; said inverter stage being coupled to the output of one of the X-th to $n$-th shift register stages, said counter thereby counting on the scale of $2n$-(X-1).

* * * * *